United States Patent
Birtcher et al.

(10) Patent No.: US 7,261,118 B2
(45) Date of Patent: Aug. 28, 2007

(54) METHOD AND VESSEL FOR THE DELIVERY OF PRECURSOR MATERIALS

(75) Inventors: Charles Michael Birtcher, Valley Center, CA (US); Richard J. Dunning, Fallbrook, CA (US); Robert Daniel Clark, San Marcos, CA (US); Arthur Kenneth Hochberg, Solana Beach, CA (US); Thomas Andrew Steidl, Escondido, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 403 days.

(21) Appl. No.: 10/902,778

(22) Filed: Aug. 2, 2004

(65) Prior Publication Data
US 2005/0039794 A1    Feb. 24, 2005

Related U.S. Application Data

(60) Provisional application No. 60/587,295, filed on Jul. 12, 2004, provisional application No. 60/496,187, filed on Aug. 19, 2003.

(51) Int. Cl.
*F17D 1/00* (2006.01)
(52) U.S. Cl. ............... 137/13; 137/268; 137/344; 422/129
(58) Field of Classification Search .......... 137/268, 137/13, 344; 422/129
See application file for complete search history.

(56) References Cited

U.S. PATENT DOCUMENTS

| | | | |
|---|---|---|---|
| 4,723,967 A | * | 2/1988 | Tom .............. 137/205.5 |
| 4,916,828 A | | 4/1990 | Yamane et al. |
| 4,947,790 A | | 8/1990 | Gärtner et al. |
| 5,019,423 A | | 5/1991 | Hiai et al. |
| 5,227,340 A | | 7/1993 | Pintchovski et al. |
| 5,276,585 A | | 1/1994 | Smithers |
| 5,377,429 A | | 1/1995 | Sandhu et al. |
| 5,381,605 A | | 1/1995 | Krafft |
| 5,562,132 A | | 10/1996 | Siegele et al. |
| 5,674,574 A | | 10/1997 | Atwell et al. |
| 5,707,424 A | | 1/1998 | Tom et al. |

(Continued)

FOREIGN PATENT DOCUMENTS

JP    6 032695 A    2/1994

(Continued)

*Primary Examiner*—Kevin Lee
(74) *Attorney, Agent, or Firm*—Rosaleen P. Morris-Oskanian; Joseph D. Rossi

(57) ABSTRACT

Vessel and method for the production and delivery of a precursor-containing fluid stream comprising the gaseous phase of a precursor material are disclosed herein. In one aspect, there is provided an vessel comprising: an interior volume wherein the interior volume is segmented into an upper volume and a lower volume wherein the upper volume and the lower volume are in fluid communication; a lid comprising a fluid inlet, a fluid outlet, an optional fill port, and an internal recess wherein at least a portion of the upper volume resides within the internal recess; a sidewall interposed between the lid and a base; and at least one protrusion that extends into the lower volume wherein the precursor is in contact with the at least one protrusion and wherein at least one protrusion extends from at least one selected from the lid, the sidewall, the base, and combinations thereof.

35 Claims, 10 Drawing Sheets

U.S. PATENT DOCUMENTS

| | | | |
|---|---|---|---|
| 5,953,634 A | 9/1999 | Kajita et al. | |
| 5,989,305 A | 11/1999 | Ohsaki et al. | |
| 6,058,012 A | 5/2000 | Cooper et al. | |
| 6,077,356 A | 6/2000 | Bouchard | |
| 6,089,184 A | 7/2000 | Kaizuka et al. | |
| 6,202,591 B1 | 3/2001 | Witzman et al. | |
| 6,244,331 B1 | 6/2001 | Budelman | |
| 6,424,800 B1 | 7/2002 | Kim | |
| 6,444,038 B1 | 9/2002 | Rangarajan et al. | |
| 6,470,144 B1 | 10/2002 | Tarutani et al. | |
| 6,520,218 B1 | 2/2003 | Gregg et al. | |
| 6,581,649 B2 | 6/2003 | Jursich | |
| 6,840,252 B2 * | 1/2005 | Zorich et al. | 137/240 |
| 6,909,839 B2 * | 6/2005 | Wang et al. | 392/389 |
| 2002/0078894 A1 | 6/2002 | Timmons et al. | |
| 2003/0111014 A1 | 6/2003 | Donatucci et al. | |
| 2003/0121608 A1 | 7/2003 | Chen et al. | |
| 2003/0232138 A1 | 12/2003 | Tuominen et al. | |
| 2004/0013577 A1 * | 1/2004 | Ganguli et al. | 422/129 |
| 2004/0016404 A1 | 1/2004 | Gregg et al. | |
| 2004/0025370 A1 | 2/2004 | Guenther | |
| 2004/0083963 A1 | 5/2004 | Dando et al. | |
| 2004/0083965 A1 | 5/2004 | Wang et al. | |

FOREIGN PATENT DOCUMENTS

| | | |
|---|---|---|
| JP | 2003/318170 A | 11/2003 |
| JP | 2003/332243 A | 11/2003 |
| WO | WO 01/42539 A1 | 6/2001 |
| WO | WO 03/052160 A1 | 6/2003 |
| WO | WO 2004/007793 A2 | 1/2004 |

* cited by examiner

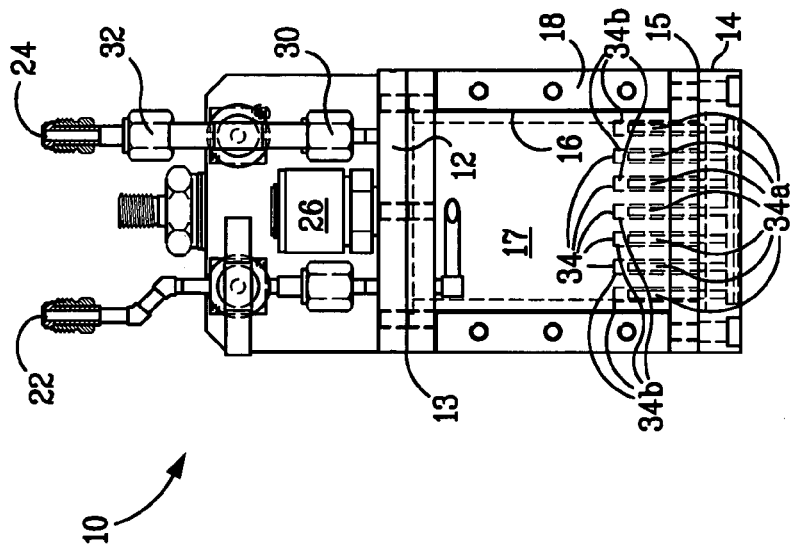
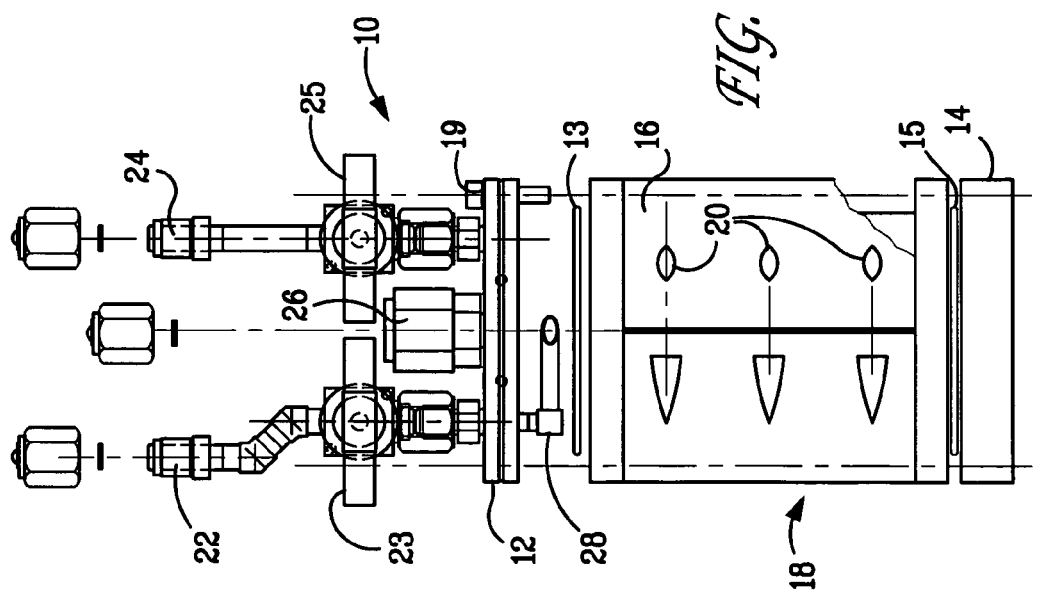

METHOD AND VESSEL FOR THE DELIVERY OF PRECURSOR MATERIALS

CROSS-REFERENCE TO RELATED APPLICATIONS

This application claims the benefit of U.S. Provisional Application No. 60/496,187, filed 19 Aug. 2003, and U.S. Provisional Application No. 60/587,295, filed Jul. 12, 2004.

BACKGROUND OF THE INVENTION

Deposition processes such as, for example, chemical vapor deposition and atomic layer deposition processes, are used in one or more steps during the manufacture of a semiconductor device to form one or more films or coatings on the surface of a substrate. In a typical CVD or ALD process, a precursor source that may be in a solid and/or liquid phase is conveyed to a reaction chamber having one of more substrates contained therein where the precursor reacts under certain conditions such as temperature or pressure to form the coating or film on the substrate surface.

When a solid precursor material is used in a CVD or ALD process, the precursor material is typically heated in a separate chamber such as an oven to a temperature sufficient to form a gas, which is then transported, typically in conjunction with a carrier gas, to the reaction chamber. In some instances, the solid precursor material is heated to its gaseous phase without forming an intermediate liquid phase. The vaporization of a solid precursor material presents difficulties in generating and conveying the precursor-containing vapor to the reaction chambers. Typical difficulties encountered include, but are not limited to, deposit buildup within the vessel, vaporizer and/or delivery lines; condensation of liquid- or solid-phase material within the vessel, vaporizer and/or delivery lines, formation of "cold spots" within the interior of the vessel; and inconsistent vapor flow to downstream reaction chambers. These difficulties may result in extended "down time" of the production equipment to remove liquid or particulate matter and may also produce relatively poor quality deposited films.

BRIEF SUMMARY OF THE INVENTION

A vessel and method comprising same for the production and delivery of a precursor-containing fluid stream comprising the gaseous phase of a precursor material is disclosed herein that satisfies some, if not all, of the needs of the art. Specifically, in one aspect, there is provided a vessel for conveying a precursor-containing fluid stream from a precursor comprising: an interior volume wherein the interior volume is segmented into an upper volume and a lower volume wherein the upper volume and the lower volume are in fluid communication; a lid comprising a fluid inlet, a fluid outlet, an optional fill port, and an internal recess wherein at least a portion of the upper volume resides within the internal recess; a sidewall interposed between the lid and a base; and at least one protrusion that extends into the lower volume wherein the precursor is in contact with the at least one protrusion and wherein the at least one protrusion extends from at least one selected from the lid, the sidewall, the base, and combinations thereof.

In another aspect of the present invention, there is provided a vessel for conveying a precursor-containing fluid stream from a precursor comprising: an interior volume wherein the interior volume is segmented into an upper volume and a lower volume wherein the upper volume and the lower volume are in fluid communication; a lid comprising a fluid inlet which directs at least one carrier gas into the interior volume of the vessel, a fluid outlet, and an internal recess wherein at least a portion of the upper volume resides within the internal recess; a sidewall having a plurality of protrusions that extend therefrom into the lower volume and an upper lip wherein at least a portion of the upper lip contacts the lid; and a separator interposed between the lid and the sidewall wherein the separator resides within the upper lip and segments the interior volume into the upper volume and a lower volume.

In a further aspect, there is provided a vessel for conveying a precursor-containing fluid stream from a precursor comprising: an interior volume wherein the interior volume is segmented into an upper volume and a lower volume by a separator and wherein the upper volume and the lower volume are in fluid communication; a lid comprising a fluid inlet which directs at least one carrier gas into the interior volume of the vessel through a "T" shaped tube, a fluid outlet, and an internal recess wherein at least a portion of the upper volume resides within the internal recess; a sidewall attached to the lid comprising a plurality of protrusions that extend therefrom into the lower volume wherein at least one of the plurality of protrusions has a surface that is non-reactive to the precursor material in contact therewith; and a heating source that is in communication with the interior volume of the vessel wherein the heating source heats the precursor to a temperature sufficient to form the precursor-containing fluid stream.

In another aspect, there is provided a method for delivering a precursor-containing fluid stream comprising a gaseous phase of a precursor comprising: introducing the precursor into an interior volume of a vessel comprising a base comprising at least one protrusion that extends into the interior volume wherein the precursor is in contact with the at least one protrusion; a pressure sealable lid comprising an inlet, an outlet, and an optional in-line filter located downstream of the outlet; a sidewall connecting the lid with the base; and a heat source that is in communication with the interior volume of the vessel; applying energy to the heat source sufficient to form the gaseous phase of the precursor contained therein; introducing at least one carrier gas into the vessel through the inlet wherein the at least one carrier gas flows in a downward direction and against the sidewall of the vessel wherein the at least one carrier gas and the gaseous phase of the precursor combine to form the fluid stream; and delivering the fluid stream through the outlet to a downstream deposition system.

These and other aspects will become apparent from the following detailed description.

BRIEF DESCRIPTION OF THE DRAWINGS

FIG. 1 is an exploded side view of one embodiment of the vessel disclosed herein.

FIG. 2 provides an assembled side view of the vessel of FIG. 1 illustrating the interior volume.

DETAILED DESCRIPTION OF THE INVENTION

Figure 3:
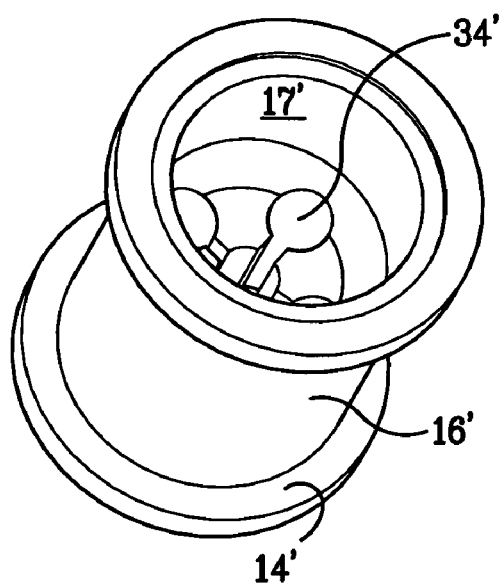
FIG. 3 is an isometric view of an integrated sidewall and base assembly of another embodiment of the vessel disclosed herein.

A vessel for the vaporization of a precursor material, particularly a solid precursor, and a method comprising same are disclosed herein. The vessel is typically constructed of a vessel having a base, lid, and sidewall that define an interior volume to contain the precursor material. Upon application of heat, the precursor material may transform from a solid and/or liquid phase to its gaseous phase. The precursor material may be a solid and/or a liquid. Examples of precursor materials that may be used in the vessel include, but are not limited to, dimethyl hydrazine, trimethyl aluminum (TMA), hafnium chloride ($HfCl_4$), zirconium chloride ($ZrCl_4$), indium trichloride, aluminum trichloride, titanium iodide, tungsten carbonyl, $Ba(DPM)_2$, bis di pivaloyl methanato strontium ($Sr(DPM)_2$), TiO $(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, inorganic precursors incorporating alkyl-amidinate ligands, organometallic precursors such as zirconium tertiary butoxide (Zr (t-OBu)$_4$), tetrakisdiethylaminozirconium ($Zr(NEt_2)_4$), tetrakisdiethylaminohafnium (Hf $(NEt_2)_4$), tetrakis (dimethylamino) titanium (TDMAT), tertbutyliminotris (deithylamino) tantalum (TBTDET), pentakis(dimethylamino) tantalum (PDMAT), pentakis (ethylmethylamino) tantalum (PEMAT), tetrakisdimethylaminozirconium ($Zr(NMe_2)_4$), and hafniumtertiarybutoxide (Hf(t-OBu)$_4$), and mixtures thereof.

In one embodiment, the base, the sidewall, and/or the interior surface of the lid of the vessel have at least one protrusion, which extends into the interior volume and contacts the precursor material. The at least one protrusion may aid in transferring the heat directly into the precursor material. In one embodiment, an inert carrier gas such as, for example, nitrogen, hydrogen, helium, argon, or other gas, is flowed through the interior volume and combines with the gaseous phase of the precursor material to provide a precursor-containing gaseous stream. In another embodiment, a vacuum may be used, alone or in conjunction with the inert gas, to withdraw the precursor-containing gaseous stream from the vessel. The precursor-containing gaseous stream may be then delivered to downstream production equipment, such as, for example, a reaction chamber for deposition. The vessel may provide for a continuous flow of precursor-containing gaseous stream while avoiding "cold spots" or other problems attributable to the condensation of vapors contained therein. The vessel may also provide a consistent and reproducible flow rate, which may be advantageous for a variety of manufacturing processes.

FIGS. 1 and 2 provide an exploded side view and cross-sectional view, respectively, of one embodiment of the vessel of the present invention wherein the at least one protrusion extends from the base of the vessel. In FIGS. 1 and 2, the vessel is a vessel 10 having a lid 12, a base 14, sidewalls 16, and a pair of seals 13 and 15 located near lid 12 and base 14, respectively. While vessel 10 is shown as being substantially cylindrical in shape, it is understood that vessel may be shaped, for example, as a hollow square or rectangular tube. Seals 13 and 15 which may be a seal, o-ring, gasket, insert or the like may be used to allow vessel 10 to maintain a vacuum or sustained pressure and may be constructed of a metal or a polymeric material. Alternatively, lid 12 and/or base 14 may be aligned onto sidewall 16 to form an airtight or pressure-tight seal without the need for one or both of seals 13 and 15. Lid 12 may be fastened onto the sidewall 16 through the one or more fasteners 19 such as a screw or pin as shown in FIG. 1. In an alternative embodiment, lid 12 may be fastened onto sidewall 16 through grooves that correspond to complementary recesses that align and allow lid 12 to be fastened onto sidewall 16 (not shown). In still further embodiments, lid 12 may be fastened onto sidewall 16 through welding, bonding, adhesives, or other means. Alignment pins (not shown) may be used to ensure proper alignment and fit between the lid and the sidewall and/or the sidewall and base for embodiments where the base is removable.

Lid 12, base 14, and sidewalls 16 define an interior volume 17 to contain the precursor material. Lid 12, base 14, and side walls 16 may be constructed of a metal or other material that can withstand the operating temperatures of vessel 10. In certain embodiments, at least a portion of lid 12, base 14, and side walls 16 may be chemically non-reactive to the precursor material contained therein. In these or in alternative embodiments, at least a portion of lid 12, base 14, and side walls 16 may be thermally conductive. Exemplary metals for lid 12, base 14, and side walls 16 include stainless steel, titanium, chrome, zirconium, monel, impervious graphite, molybdenum, cobalt, anodized aluminum, aluminum alloys, silver, silver alloys, copper, copper alloys, lead, nickel clad steel, graphite, a ceramic material, doped or undoped, or combinations thereof. In one embodiment, at least a portion of the surface that contacts the precursor may be plated with various metals such as titanium, chrome, silver, tantalum, gold, platinum, titanium and other materials wherein the aforementioned plating materials can be doped or undoped to increase surface compatibility. In these embodiments, the plating material may be non-reactive to the precursor material contained therein.

Lid 12 may contain a fluid inlet 22 for the flow of an inert carrier gas or mixture thereof and a fluid outlet 24 for the flow of the precursor-containing fluid stream. Exemplary inert carrier gases that may be introduced into vessel 10 through inlet 22 include, but not limited to, hydrogen, helium, neon, nitrogen, argon, xenon, krypton, or mixtures thereof. In certain embodiments, the precursor-containing fluid stream is withdrawn from vessel 10 without the aid of a carrier gas but rather a vacuum, pressure differential, or other means. In these embodiments, inlet 22 and any valves or structures associated therewith may be optional. Lid 12 is also depicted having a fill port 26 for introducing the precursor material (not shown) into interior volume 17. In alternative embodiments, precursor material can be introduced into interior volume 17 through inlet 22, base 14 (particularly in those embodiments where base 14 is removable) or other means besides fill port 26. In some embodiments, such as that depicted in FIGS. 1 and 2, inlet 22 and outlet 24 may include valves 23 and 25 that act to control the flow of fluid into and out of vessel 10. Valves 23 and 25 may be manual, automatic such as pneumatic, or the like and preferably are capable of operating at the operating temperatures of the vessel. In certain embodiments, valves 23 and 25 may be fitted with disconnect fittings to faciliate removal of vessel 10 from the process line. Brackets (not shown) to minimize the bending of the inlet 22 and outlet 24 tubing may support valves 23 and 25. Further, the inlet and outlet tubing may be connected with a standard gas tight fitting, such as a VCR™ fitting manufactured by the Swagelok Company of Cleveland, Ohio, that is used to connect two separate pieces of piping. In some embodiments, the outlet 24 may have one or more filters 30 and 32 that are placed in-line on the outlet tubing to remove any impurities or particulate matter from the precursor-containing fluid stream. Filters 30 and 32 may be comprised of a porous material (not shown) that is chemically unreactive to the precursor-containing fluid stream and or sufficient particle size to capture any impurities or particulate matter in the precursor-containing fluid stream as it passes therethrough.

In some embodiments such as that shown in FIGS. 1 and 2, inlet 22 may further have a vortex-generating inlet 28 that directs the flow of the inert gas downward into the interior volume 17 and along the internal surface of sidewall 16. While vortex generating inlet is depicted in FIGS. 1 and 2 as a tube that extends tangentially into interior volume 17 and resembles a "L", it is envisioned that other configurations such as, for example, a fin extending from side wall 16, a "J" shaped tube, or a "T" shaped tube may also direct the laminar flow of the inert carrier gas. In the latter embodiment, the "T" shaped tube may be angled on one or both ends and/or may be oversized. In certain embodiments, outlet 24 may also have a tube that extends into interior volume 17 that has a "T" shaped tube or other configuration. In these embodiments, the "T" shaped tube on outlet 24 may be used in addition to, or in lieu of, the "T" shaped tube on the fluid inlet.

In the embodiment shown in FIGS. 1 and 2, vessel 10 further comprises a thermally conductive jacket 18 that surrounds at least a portion of vessel 10. Thermally conductive jacket may allow for the uniform distribution of heat and improve the conduction of heat into the precursor material contained within the interior volume 17 of vessel 10. Thermally conductive jacket may be secured around vessel 10 via fasteners and/or a different material that allows for the expansion of the jacket upon heating. For example, thermally conductive jacket 18 may be comprised of aluminum whereas the sidewall 16 of vessel 10 may be comprised of stainless steel 16. Thermally conductive jacket 18 may be secured around sidewall 16 using springs to account for thermal expansion upon heating the vessel and precursor material contained therein.

Figure 6:
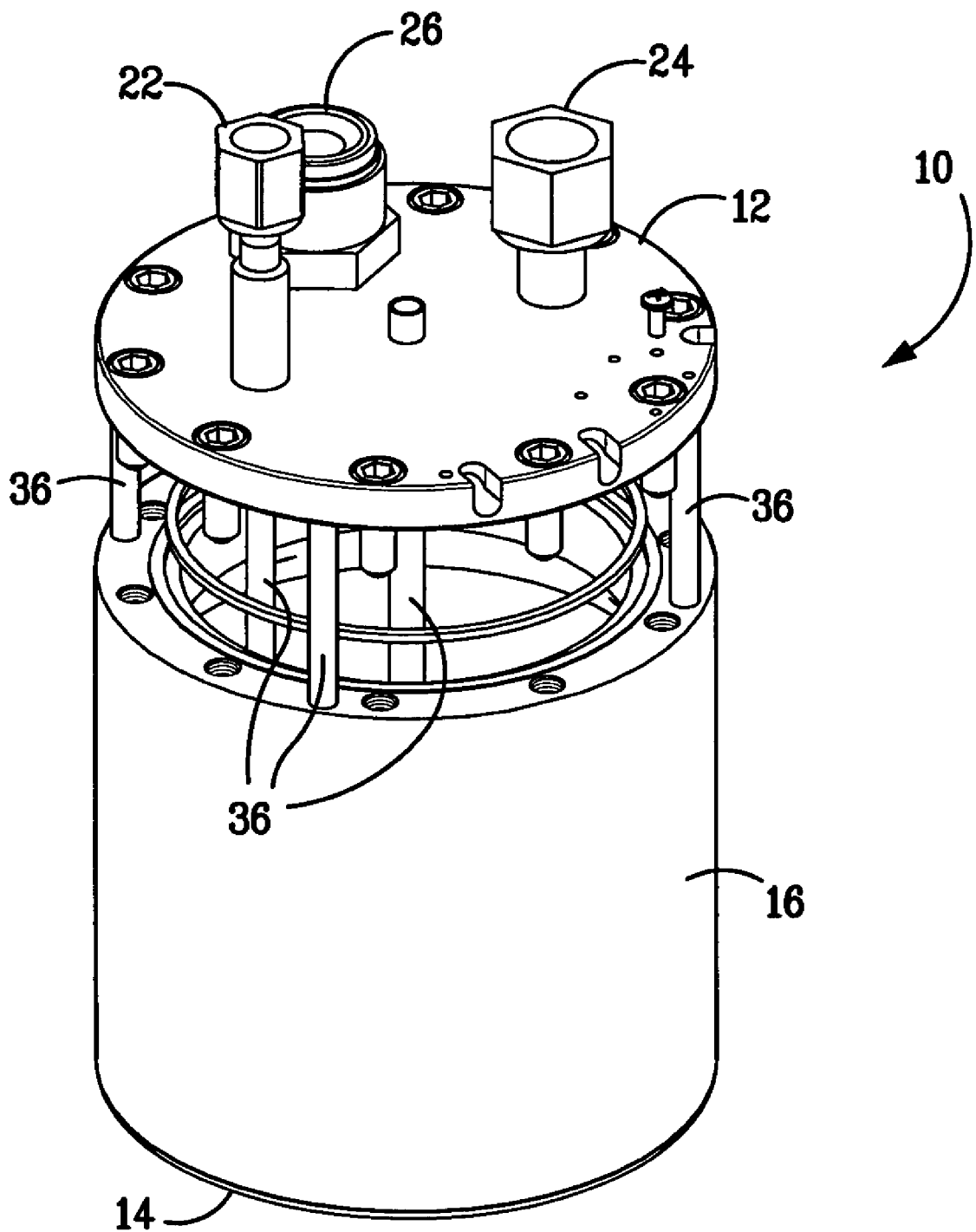
FIG. 6 is an exploded isometric view of one embodiment of the vessel disclosed herein that contains heater cartridges that are inserted into the vessel.

Vessel 10 and the precursor material contained therein may be heated to the temperature at which the material is in its gaseous phase, or sublimation temperature when the precursor is a solid material, through a variety of means that include, but are not limited to, strip heaters, radiant heaters, circulating fluid heaters, resistant heating systems, inductive heating systems, or other means that can be used alone or in combination. These heating sources may be external and/or internal in relation to vessel 10. In some embodiments, the entire vessel 10 may be introduced into an oven. In other embodiments, base 14 may have one or more heating elements of cartridges contained therein. FIG. 6 illustrates an embodiment wherein the heating cartridges 36 are inserted into the interior volume 17 of vessel 10 in various places. Still other embodiments may employ one or more inductive heating coils operated by an RF power supply. Yet other embodiments may employ a heater that is in fluid communication with the carrier gas supply that heats the carrier gas to a certain temperature prior to introduction into vessel 10.

Vessel 10 may further have one or more thermocouples, thermistors, or other temperature sensitive devices that can monitor that temperature of vessel 10 and the precursor material contained therein. The one or more thermocouples may be located in the base, lid, interior volume and/or other areas of the vessel. The one or more thermocouples or other temperature sensitive devices may be connected to a controller or computer that is in electrical communication with the heating source to maintain a uniform temperature within the interior volume of the vessel and the chemical contained therein.

Figure 5:
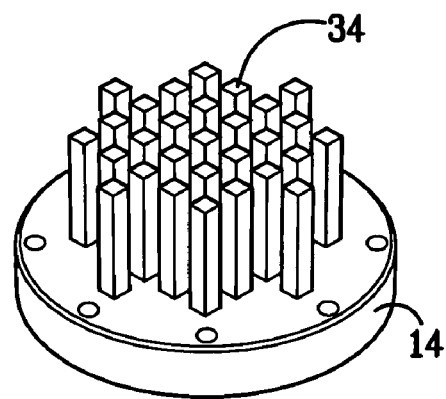
FIG. 5 is an isometric view of a removable base of one embodiment of the present invention that contains a plurality of protrusions.

Vessel 10 may further have one or more protrusions 34 that extend into the interior volume 17. FIGS. 1, 2, and 5 provide an illustration of an embodiment wherein a plurality of "spike-shaped" protrusions 34 is employed. Protrusions 34 may be comprised of a thermally conductive material or a composite thereof. In some embodiments such as that illustrated in FIG. 2, protrusions 34 may be comprised of a thermally conductive core such as copper 34a and a non-reactive surface such as stainless steel 34b that contacts the precursor material. In the embodiment shown in FIG. 5, base 14 may be removable from sidewall 16 to allow for ease of cleaning and servicing. While protrusions 34 extend from base 14 in the Figures, it is envisioned that protrusions 34 may also extend into interior volume 17 from the sidewall 16, lid 12, base 14, or combinations thereof. Protrusions 34 contact the precursor material contained therein to improve heat transfer. Protrusions 34 are arranged to allow for the unimpeded flow of gas between and amongst the protrusions and the precursor material contained therein. Further, protrusions 34 may also keep the precursor material from agglomerating.

Figure 4:
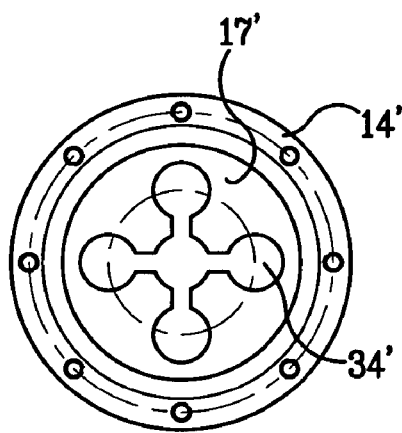
FIG. 4 is a top view of the integrated sidewall and base assembly of FIG. 2.

FIGS. 3 and 4 depict a "clover-leaf" configured protrusion 34' that extends from base 14'. Base 14' and sidewall 16' are depicted as an integrated assembly; however, base 14 may be removable. The cloverleaf configured protrusion 34' may divide interior volume 17' into separate, but interconnected, areas that allow the unimpeded flow of carrier gas within the volume.

FIG. 7 and FIGS. 7a through 7g provide an example of an embodiment of the vessel 100 disclosed herein where the at least one protrusion 101 are "fin-shaped" and extend from the sidewall 104 (which is an integrated sidewall and base assembly) of vessel 100 into interior volume 113. In the embodiment depicted, fin-shaped protrusions 101 are substantially perpendicular to fluid inlet assembly and fluid outlet assembly 110 and 112. Referring again to FIG. 7, vessel 100 consists of a lid 102, sidewall 104, an inner lip 106, a fluid inlet assembly 110 that allows for the flow of an inert carrier gas or mixture thereof, a fluid outlet assembly 112 that allows for the flow of the precursor-containing fluid stream, and a fill port 108 for introducing the precursor material into interior volume 113 of vessel 100. In certain embodiments, fill port 108 may used as a level sensing port. In these embodiments, the port may contain, for example, a window, sensor, probe, and/or other means to detect the presence of precursor within the vessel.

Figure 7:
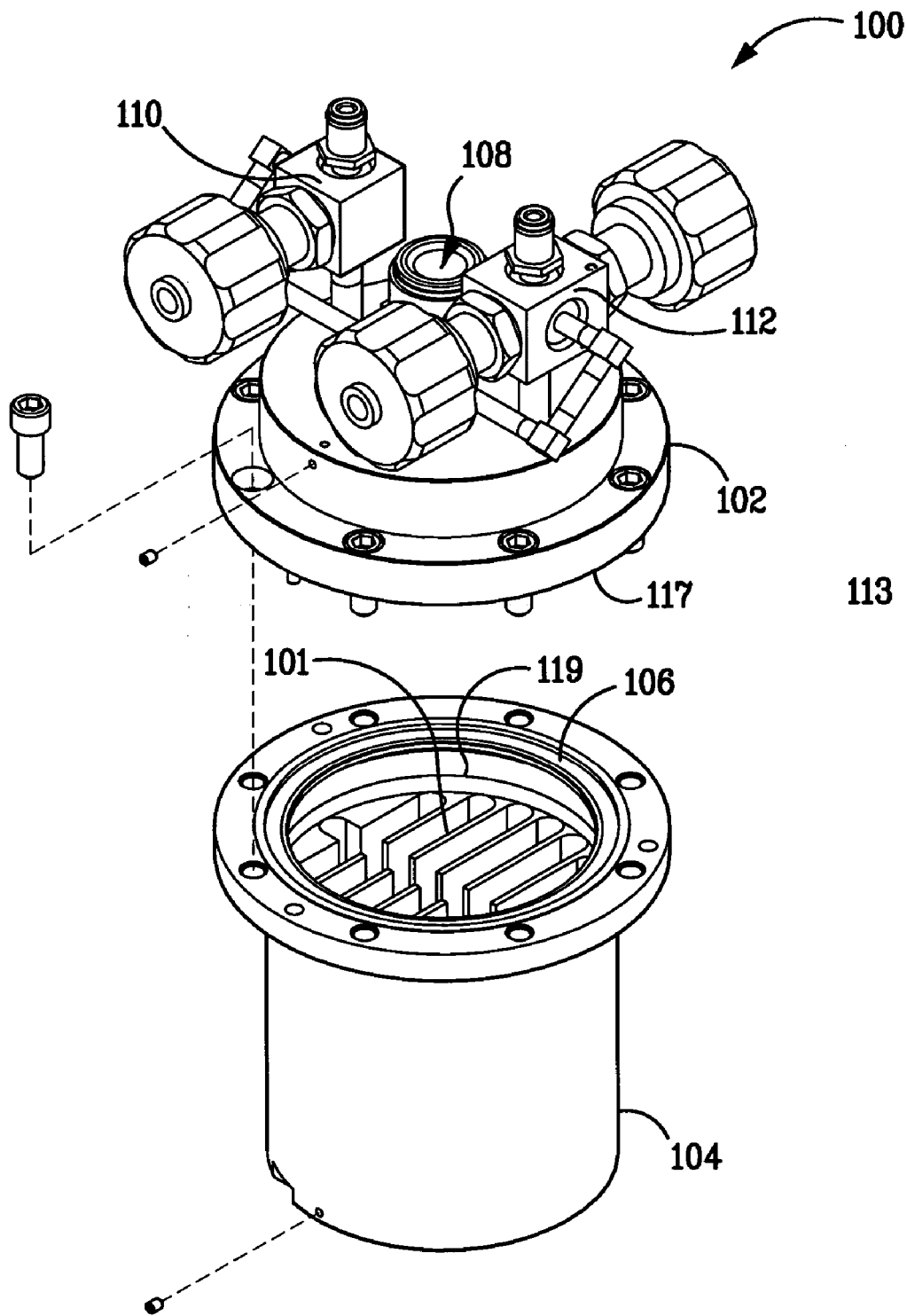
FIG. 7 provides an exploded, isometric view of another vessel disclosed herein wherein the protrusions are "fin-like" and extend from the sidewalls.
Figure 7A:
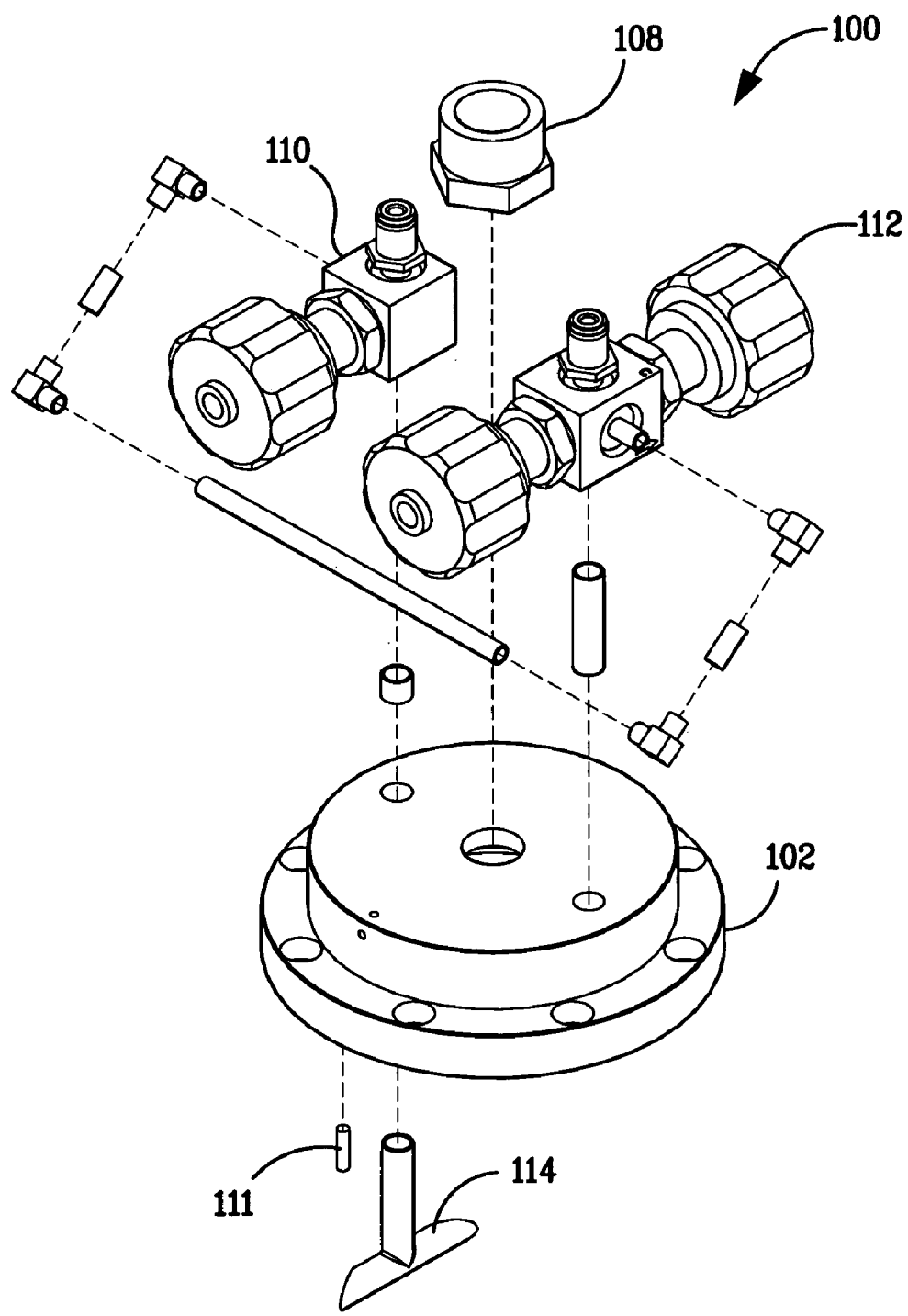
FIG. 7a is an exploded, isometric view of the lid of the vessel in FIG. 7.
Figure 7B:
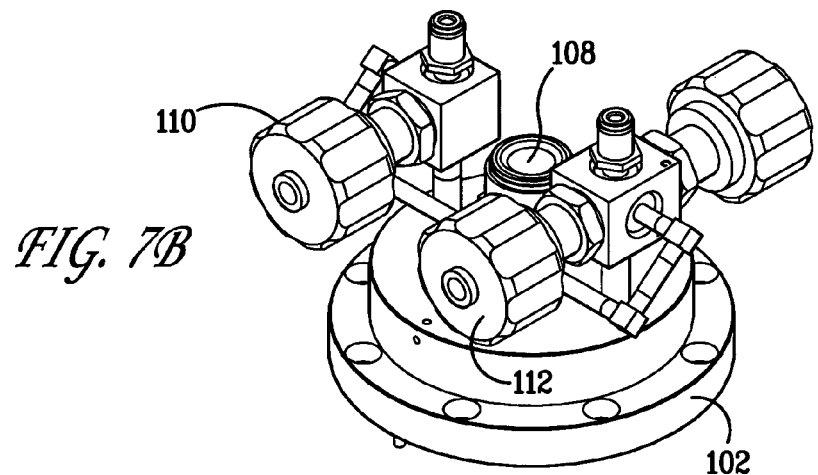
FIG. 7b is an assembled, isometric view of the lid of the vessel in FIG. 7.
Figure 7C:
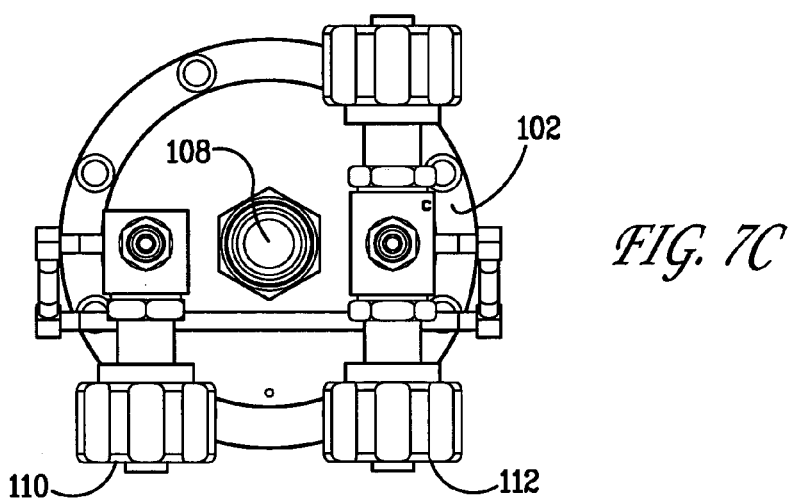
FIG. 7c is a top view of the lid of the vessel in FIG. 7.

FIGS. 7a through 7c provide various detailed views of lid 102 of vessel 100. As shown in FIGS. 7a and 7b, vessel 100 has a "T" shaped tube 114 that aids in the flow of incoming carrier gas through 110 assembly into the interior volume 113 of vessel 100. In these embodiments, "T" shaped tube 114 may reduce the laminar flow of the incoming carrier gas thereby minimizing the possibility of carrying unsublimated precursor in the outgoing precursor-containing fluid stream. Lid 102 may further employ one or more alignment pins 111 to aid in the proper fitting and alignment of lid 102 to sidewall 116.

Figure 7D:
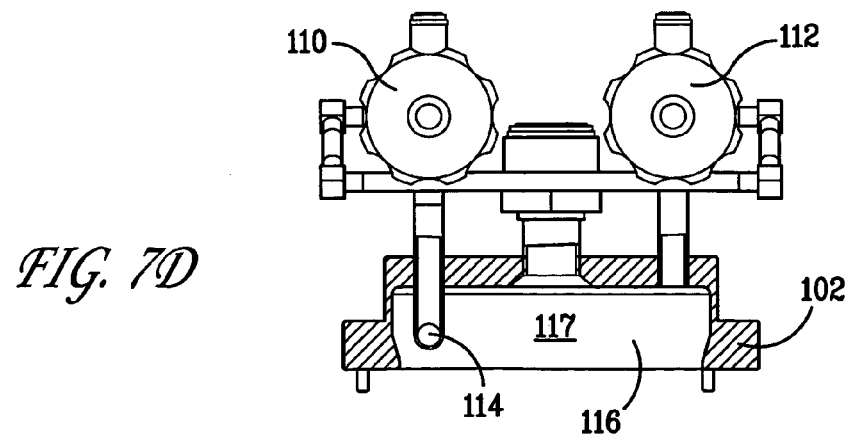
FIG. 7d is a mixed elevation cross-sectional view of the lid of the vessel in FIG. 7.

FIG. 7d provides a detailed side view of assembled lid 102, which illustrates the inner recess 116 of lid 102 which may aid in directing the flow of the incoming carrier gas. As FIG. 7d illustrates, inner recess 116 contains at least a portion of upper volume 117 and may direct the flow of the incoming carrier gas away from the unsublimated precursor.

Figure 7E:
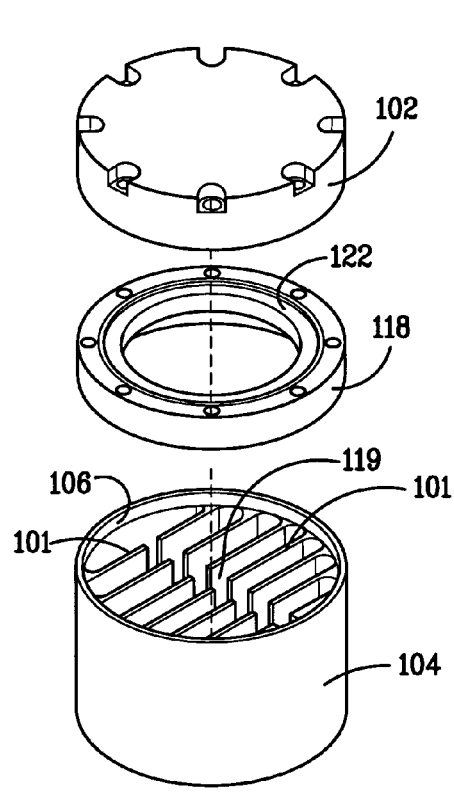
FIG. 7e is an exploded, isometric view of the body of the vessel in FIG. 7.
Figure 7F:
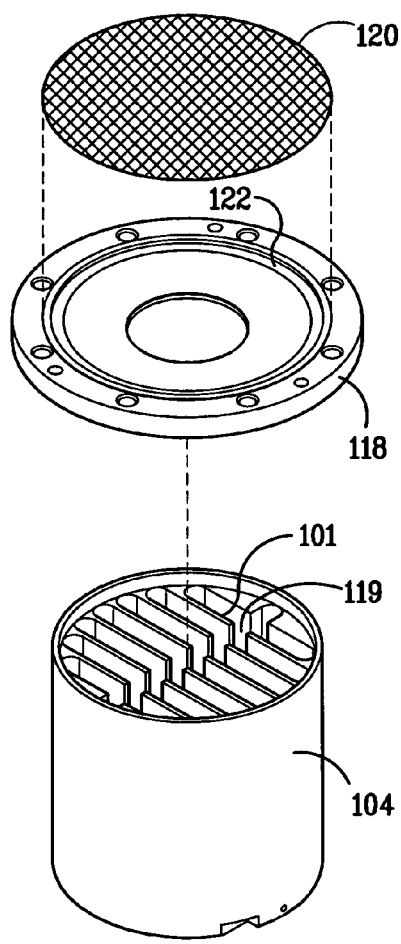
FIG. 7f is an exploded, isometric view that shows the relationship between the separator and the body of the vessel in FIG. 7.
Figure 7G:
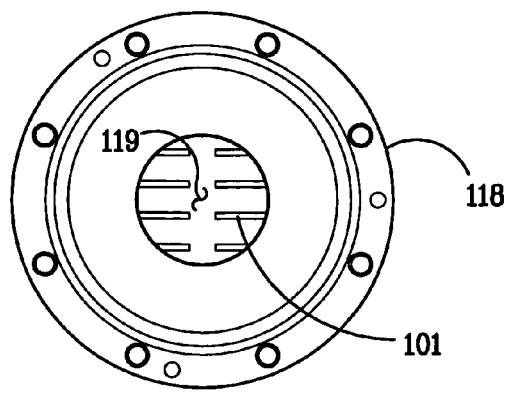
FIG. 7g is a top view illustrating a separator that is interposed between the body of the vessel in FIG. 7 and the lid (not shown).

In certain embodiments, optional separator 118 may be added to the vessel to further prevent unsublimated precursor from mixing with the outgoing precursor-containing fluid stream. FIGS. 7e through 7g provide an illustration of separator 118 that acts to partition the interior volume 113 of the vessel into upper volume 117 and a lower volume 119 between the lower body of the container and the lid. Separator 118 separates lid 102 (which are shown without inlet and outlet assemblies 110 and 112 and fill port 108) and base 104.

Depending upon the precursor, there may be a need to stop the entrainment of solid in the outgoing precursor-containing fluid stream. In these embodiments, vessel 10 and 100 may further include an optional stainless steel frit 120, which may prevent unsublimated precursor from entering the outgoing precursor-containing fluid stream. The optional stainless steel frit may have a pore size that ranges from 0.1 to 100 microns. The optional frit can be installed anywhere within interior volume 113 and/or the fluid path of the outgoing precursor-containing fluid. In one particular embodiment such as that shown in FIG. 7f, one or more frits may be installed in an inner recess 122 on separator 118.

In one embodiment, vessel 10 and 100 may further comprise a window (not shown in the figures) that is positioned to determine the contents within the interior volume 17. Suitable materials include transparent materials that have a sufficient thermal conductivity to minimize condensation and deposition of vapors on the window including, for example, diamond, sapphire, silicon carbide, transparent ceramic materials, and the like.

Operating temperatures of the vessel may vary depending upon the precursor material contained therein but may generally range from about 25° C. to about 500° C., or from about 100° C. to about 300° C. Operating pressure of the vessel may range from about $10^{-2}$ torr to about 1,000 torr, or from about 0.1 torr to about 200 torr.

In one embodiment, the method of using the vessel disclosed herein includes introducing a precursor material through fill port 26, such as a solid precursor material, into the interior volume 17 of vessel 10 wherein the solid precursor material contacts one or more protrusions 34 that extend into the interior volume 17. It is preferable that the precursor material is filled to the point where it is in continuous contact with at least a portion of the at least one protrusion and does not extend beyond the area of the interior volume 17 containing the at least one protrusion. Lid 12, base 14, and sidewall 16 are fastened to provide a pressure-tight or airtight seal. Valve 23 is opened to allow for the flow of an inert carrier gas through vortex-generating tube 28 and into interior volume 17. A heating source such as heating cartridges is used to bring the precursor material to sublimation temperature and form a precursor gas. The inert carrier gas combines with the precursor gas to form the precursor-containing fluid stream. The precursor-containing fluid stream passes through outlet 24 and through in-line filters 30 and 32 to a down stream production device such as a reaction chamber used for thin film deposition.

In yet another embodiment, the method includes introducing a precursor material through fill port 108, such as a solid precursor material, into the interior volume 113 of vessel 100 wherein the solid precursor material contacts one or more protrusions 112 that extend into the lower volume 119. It is preferable that the precursor material is filled to the point where it is in continuous contact with at least a portion of the at least one protrusion 101 and does not extend beyond the area of the lower volume 119 containing the at least one protrusion 101. Lid 102 and body 104 are fastened to provide a pressure-tight or airtight seal. Valve 110 is opened to allow for the flow of an inert carrier gas through 'T' shaped tube 114 and into interior volume 113. A heating source such as heating cartridges is used to bring the precursor material to sublimation temperature and form a precursor gas. The inert carrier gas combines with the precursor gas to form the precursor-containing fluid stream. The precursor-containing fluid stream passes through separator 118, optional stainless steel frit 120, and fluid outlet 112 to a down stream production device such as a reaction chamber used for thin film deposition.

The vessel and method will be illustrated in more detail with reference to the following Examples, but it should be understood that the present invention is not deemed to be limited thereto.

EXAMPLES

Figure 8:
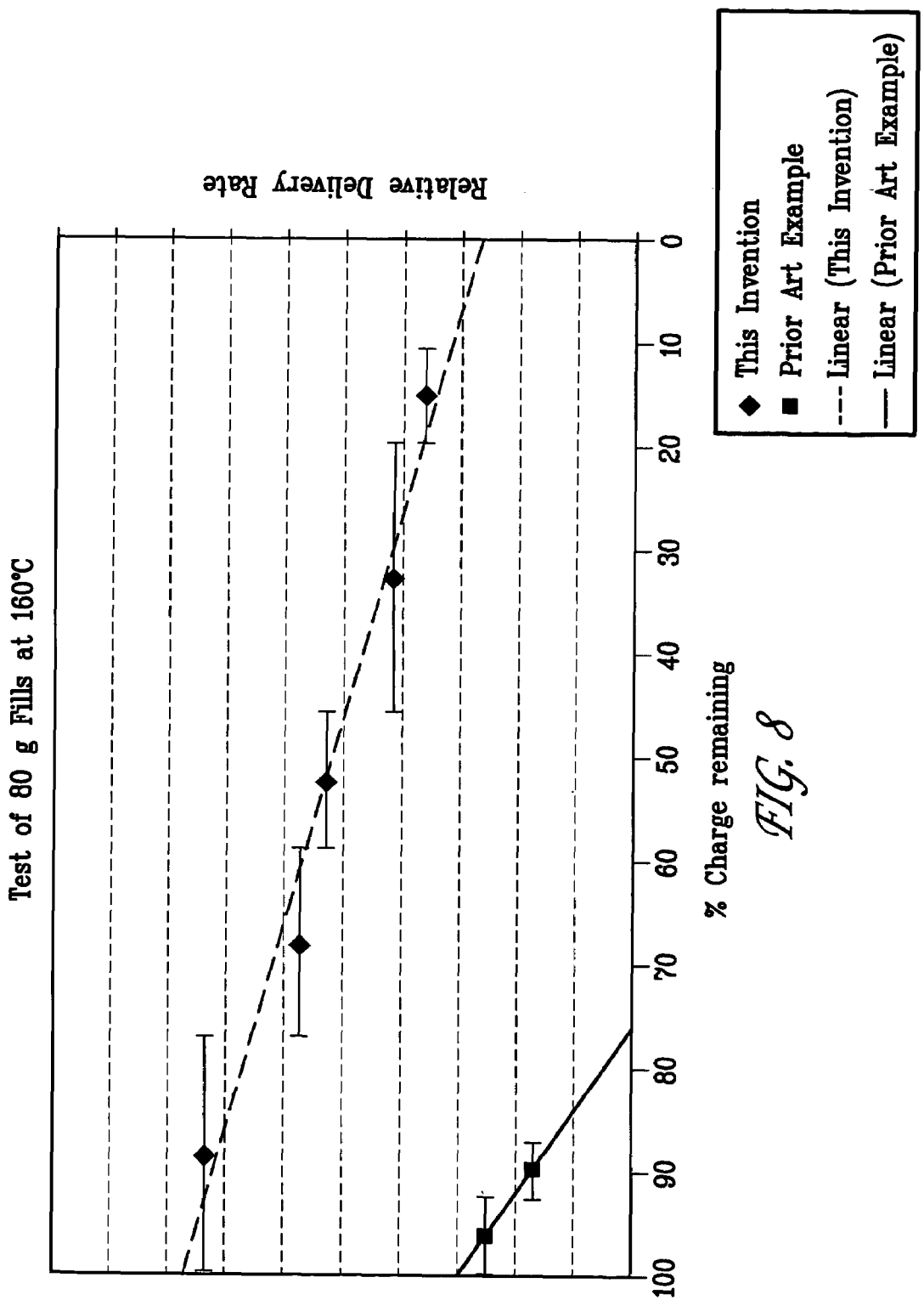
FIG. 8 is a graph illustrating the relative delivery rate vs. % charge remaining for a vessel described herein and a prior art vessel using a fill of 80 grams of precursor and a temperature of 160° C.
Figure 9:
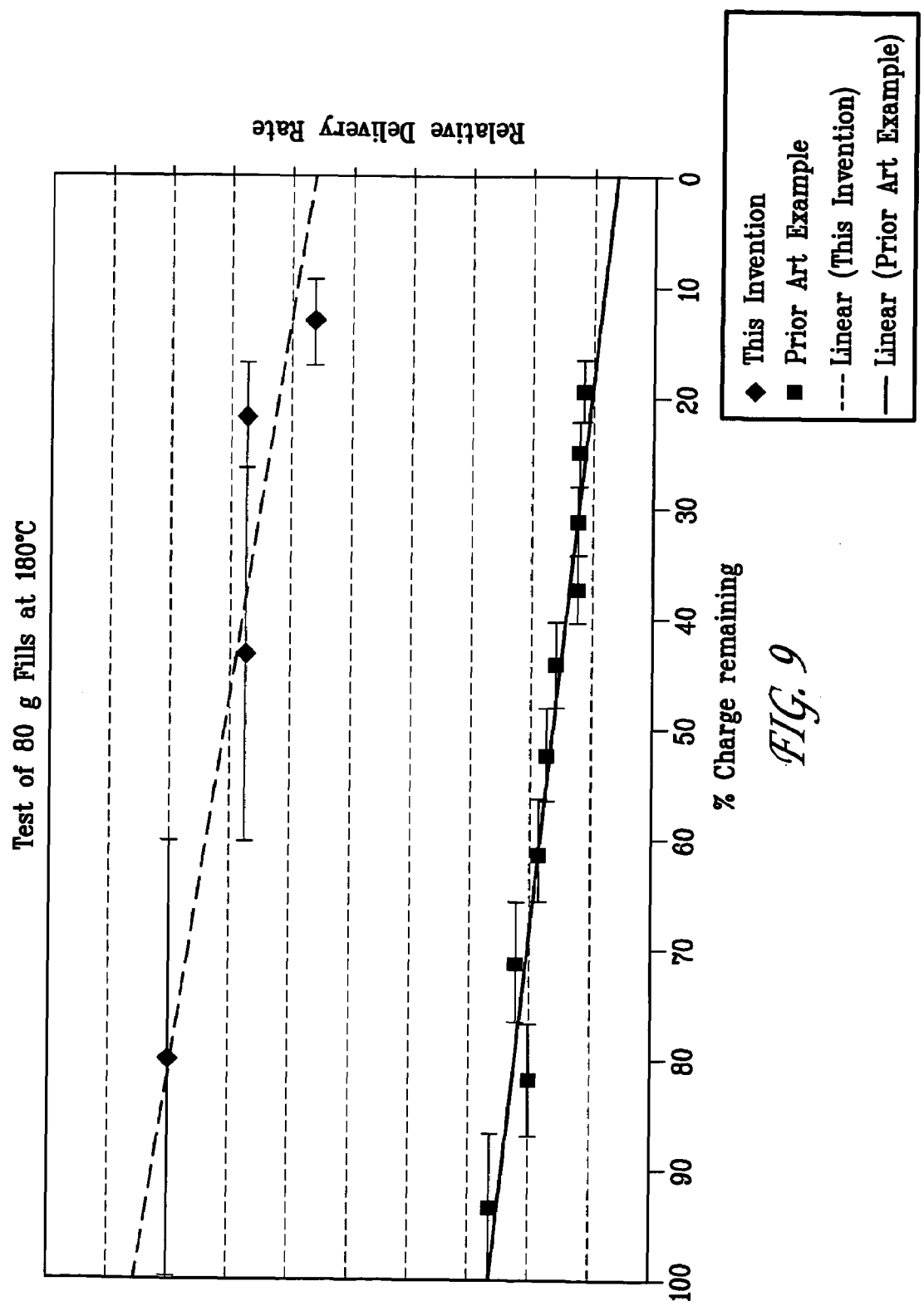
FIG. 9 is a graph illustrating the relative delivery rate vs. % charge remaining for a vessel described herein and a prior art vessel using a fill of 80 grams of precursor and a temperature of 180° C.
Figure 10:
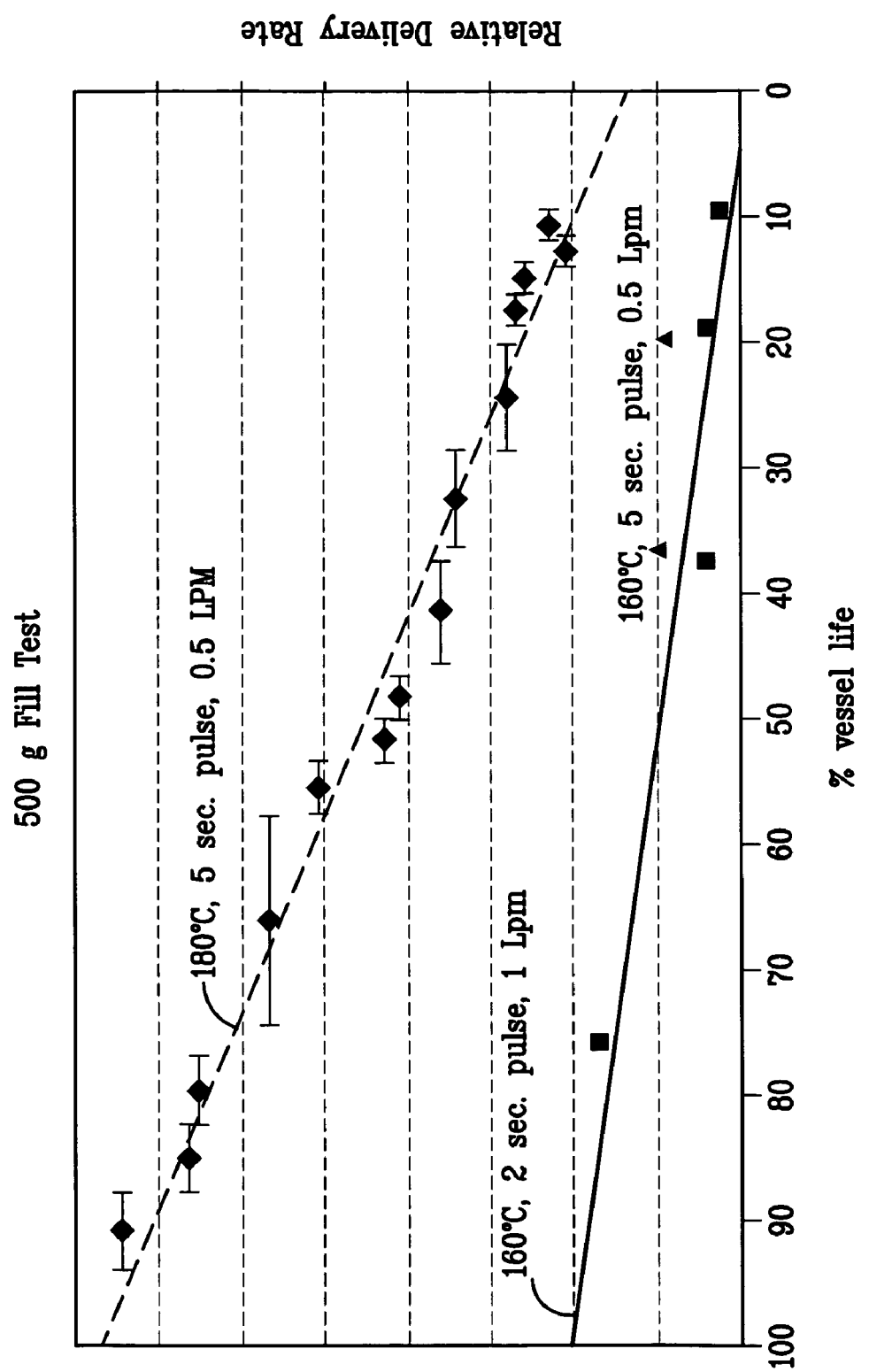
FIG. 10 is a graph illustrating the relative delivery rate vs. % vessel life for a vessel described herein using a fill of 500 grams of precursor.

The solid precursor hafnium chloride ($HfCl_4$) was introduced into a vessel described herein and heated until it reached sublimation. A carrier gas, nitrogen, was introduced into the vessel at a flow rate of 1,000 sccm. A similar quantity of the precursor was introduced into a prior art quartz container. The prior art quartz container did not have protrusions that contacted the precursor material. In FIGS. 8 and 9, a 80 g amount of precursor material was heated to 160° C. and 180° C., respectively, using a 5 second pulse and flow of 0.5 liters per minute (LPM). In FIG. 10, the diamond, square and triangular data points represent data obtained using a 500 gram fill heated to the following conditions: 180° C., 5 second pulse, and 0.5 LPM, 160° C., 2 second pulse, and 1 LPM, and 160° C., 5 second pulse, and 0.5 LPM, respectively.

While the invention has been described in detail and with reference to specific examples thereof, it will be apparent to one skilled in the art that various changes and modifications can be made therein without departing from the spirit and scope thereof.

We claim:

1. A vessel for conveying a precursor-containing fluid stream from a precursor material, the vessel comprising:
   an interior volume wherein the interior volume is segmented into an upper volume and a lower volume wherein the upper volume and the lower volume are in fluid communication;
   a lid comprising a fluid inlet, a fluid outlet, an optional fill port, and an internal recess wherein at least a portion of the upper volume resides within the internal recess;
   a sidewall interposed between the lid and a base; and
   at least one protrusion that extends into the lower volume having a top surface, wherein the precursor material, when introduced, is in contact with the at least one protrusion, wherein the at least one protrusion extends from at least one selected from the sidewall, the base, and combinations thereof, and wherein there is a space between the top surface of the at least one protrusion and the lid.

2. The vessel of claim 1 further comprising a heating source that is in communication with the interior volume of the vessel wherein the heating source heats the precursor material to a temperature sufficient to form the fluid stream.

3. The vessel of claim 2 wherein the heating source comprises a thermally conductive jacket that surrounds at least a portion of the vessel.

4. The vessel of claim 2 wherein the heating source comprises a plurality of heating cartridges.

5. The vessel of claim 4 wherein the heating cartridges are inserted into the base of the vessel.

6. The vessel of claim 1 further comprising a filter located downstream of the fluid outlet.

7. The vessel of claim 6 further comprising a filter located upstream of the fluid outlet.

8. The vessel of claim 1 wherein the base is removable.

9. The vessel of claim 1 wherein the base and the sidewall are integrated.

10. The vessel of claim 1 wherein the base comprises at least one protrusion.

11. The vessel of claim 1 wherein the at least one protrusion is comprised of a surface that is non-reactive to the precursor material contained therein.

12. The vessel of claim 1 wherein the at least one protrusion has a cloverleaf design.

13. The vessel of claim 1 wherein at least one protrusion extends from the sidewall.

14. The vessel of claim 1 wherein the fluid inlet further comprises a tube that directs the flow of a carrier gas into the upper volume and across the sidewall of the vessel.

15. The vessel of claim 14 wherein the tube is "T" shaped.

16. The vessel of claim 1 wherein the fluid outlet further comprises a tube that directs the flow of the precursor-containing fluid out of the vessel.

17. The vessel of claim 16 wherein the tube is "T" shaped.

18. The vessel of claim 1 wherein the lid is removable.

19. The vessel of claim 15 wherein the "T" shaped tube forming the fluid inlet has at least one angled end.

20. The vessel of claim 17 wherein the "T" shaped tube forming the fluid outlet has at least one angled end.

21. A vessel for conveying a precursor-containing fluid stream from a precursor material, the vessel comprising:
   an interior volume wherein the interior volume is segmented into an upper volume and a lower volume wherein the upper volume and the lower volume are in fluid communication;
   a lid comprising a fluid inlet which directs at least one carrier gas into the interior volume of the vessel, a fluid outlet, and an internal recess wherein at least a portion of the upper volume resides within the internal recess;
   a sidewall having a plurality of protrusions that extend therefrom into the lower volume and an upper lip wherein at least a portion of the upper lip contacts the lid; and
   a separator interposed between the lid and the sidewall wherein the separator resides within the upper lip and segments the interior volume into the upper volume and the lower volume.

22. The vessel of claim 21 further comprises a heating source that is in communication with the interior volume of the vessel wherein the heating source heats the precursor material to a temperature sufficient to form the fluid stream.

23. The vessel of claim 22 wherein the heating source comprises a thermally conductive jacket that surrounds at least a portion of the sidewall.

24. The vessel of claim 21 further comprising a stainless steel frit in contact with at least a portion of the separator.

25. The vessel of claim 21 wherein at least a portion of the protrusions comprise a surface that is non-reactive to the precursor material in contact therewith.

26. The vessel of claim 25 wherein at least a portion of the protrusions comprise a thermally conductive core.

27. The vessel of claim 21 wherein the fluid inlet is a "T" shaped tube having at least one angled end.

28. The vessel of claim 21 wherein the fluid outlet is a "T" shaped tube having at least one angled end.

29. A vessel for conveying a precursor-containing fluid stream from a precursor material, the vessel comprising:
   an interior volume wherein the interior volume is segmented into an upper volume and a lower volume by a separator and wherein the upper volume and the lower volume are in fluid communication;
   a lid comprising a fluid inlet which directs at least one carrier gas into the interior volume of the vessel through a "T" shaped tube, a fluid outlet, and an internal recess wherein at least a portion of the upper volume resides within the internal recess;
   a sidewall attached to the lid comprising a plurality of protrusions that extend therefrom into the lower volume wherein at least one of the plurality of protrusions has a surface that is non-reactive to the precursor material when in contact therewith; and
   a heating source that is in communication with the interior volume of the vessel wherein the heating source heats the precursor material to a temperature sufficient to form the precursor-containing fluid stream.

30. The vessel of claim 29 wherein the "T" shaped tube forming the fluid inlet has at least one angled end.

31. The vessel of claim 29 wherein the fluid outlet is a "T" shaped tube having at least one angled end.

32. A method for delivering a precursor-containing fluid stream comprising a gaseous phase of a precursor, the method comprising:
   introducing the precursor into a vessel having an interior volume comprising a lower and an upper volume separated by a separator wherein the vessel comprises:
   a base; at least one protrusion that extends into the lower volume wherein the precursor is in contact with the at least one protrusion; a pressure sealable lid comprising an inlet and an outlet; and a sidewall connecting the lid with the base;

providing a heat source that is in communication with the interior volume of the vessel;

applying energy to the heat source sufficient to form the gaseous phase of the precursor contained therein;

introducing at least one carrier gas into the vessel through the inlet wherein the at least one carrier gas flows in a downward direction and against the sidewall of the vessel wherein the at least one carrier gas and the gaseous phase of the precursor combine to form the fluid stream; and delivering the fluid stream through the outlet to a downstream deposition system.

33. The method of claim 32 further comprising an in-line filter downstream of the outlet wherein the precursor-containing fluid stream flows therethrough.

34. The method of claim 32 wherein the carrier gas is introduced through a "T" shaped inlet tube having at least one angled end.

35. The method of claim 32 wherein the fluid stream is delivered through a "T" shaped outlet tube having at least one angled end.

* * * * *